(12) United States Patent
Gu et al.

(10) Patent No.: US 10,658,335 B2
(45) Date of Patent: May 19, 2020

(54) HETEROGENOUS 3D CHIP STACK FOR A MOBILE PROCESSOR

(71) Applicant: Futurewei Technologies, Inc., Plano, TX (US)

(72) Inventors: Shiqun Gu, San Diego, CA (US); Yu Lin, Shenzen (CN); Jinghua Zhu, Dongguan (CN); Guofang Jiao, San Diego, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/880,455

(22) Filed: Jan. 25, 2018

(65) Prior Publication Data

US 2018/0366442 A1  Dec. 20, 2018

Related U.S. Application Data

(60) Provisional application No. 62/520,754, filed on Jun. 16, 2017.

(51) Int. Cl.
*H01L 23/48* (2006.01)
*H01L 25/065* (2006.01)
*H01L 23/00* (2006.01)
*H01L 25/00* (2006.01)
*H01L 25/10* (2006.01)
*H01L 23/64* (2006.01)

(52) U.S. Cl.
CPC .......... *H01L 25/0657* (2013.01); *H01L 23/64* (2013.01); *H01L 24/14* (2013.01); *H01L 24/94* (2013.01); *H01L 24/97* (2013.01); *H01L 25/105* (2013.01); *H01L 25/50* (2013.01); *H01L 24/08* (2013.01); *H01L 24/16* (2013.01); *H01L 24/80* (2013.01); *H01L 2224/05647* (2013.01); *H01L 2224/08145* (2013.01); *H01L 2224/16145* (2013.01); *H01L 2224/48091* (2013.01); *H01L 2224/80047* (2013.01); *H01L 2224/80895* (2013.01); *H01L 2224/80896* (2013.01); *H01L 2224/94* (2013.01); *H01L 2224/97* (2013.01); *H01L 2225/1058* (2013.01); *H01L 2924/15311* (2013.01); *H01L 2924/181* (2013.01); *H01L 2924/1816* (2013.01)

(58) Field of Classification Search
None
See application file for complete search history.

(56) References Cited

U.S. PATENT DOCUMENTS 9,432,298 B1 * 8/2016 Smith ................. H04L 49/9057
9,786,623 B2 * 10/2017 Lin ....................... H01L 21/561
(Continued)

*Primary Examiner* — Hung K Vu
(74) *Attorney, Agent, or Firm* — Vierra Magen Marcus LLP

(57) ABSTRACT

An integrated circuit package and a system including the integrated circuit package as well as a process for assembling the integrated circuit package are provided. The integrated circuit package includes a first die manufactured on a first wafer utilizing a first node size, a second die manufactured on a second wafer utilizing a second node size, and a substrate coupled to the second die at a plurality of bump sites on a bottom surface of the second die. The first die may be mounted on a top surface of the second die utilizing a hybrid wafer bonding technique, micro bumps, or electrodeless plating.

27 Claims, 13 Drawing Sheets

(56) References Cited

U.S. PATENT DOCUMENTS

2003/0110452 A1\* 6/2003 Leahy ................. H01L 23/5385
716/120
2018/0158749 A1\* 6/2018 Yu ....................... H01L 23/3677
2018/0182744 A1\* 6/2018 Karhade ............... H01L 25/105

\* cited by examiner

HETEROGENOUS 3D CHIP STACK FOR A MOBILE PROCESSOR

This application claims the benefit of U.S. Provisional Application No. 62/520,754, titled "Heterogenous 3D Chip Stack for a Mobile Processor," filed Jun. 16, 2017, the entire contents of which is incorporated herein by reference.

FIELD OF THE INVENTION

Field of the Invention

The present disclosure relates to integrated circuits, and more particularly to architectures for mobile processors.

Background

As semiconductor manufacturing techniques have improved, the size of transistors and other integrated circuit structures has shrunk. A set of integrated circuit manufacturing technologies may be referred to as a technology node. For example, a 7 nanometer (nm) node refers to a set of manufacturing technologies related to a 7 nm node size. The smaller the node size, the more transistors that can be fit into a given area of a silicon wafer. Consequently, chips of a similar size can be made more powerful, or more chips can be manufactured on a single wafer because the size of each individual chip can be shrunk. Increasing the number of chips on a single wafer drops the per-unit cost of those chips.

However, as the node size drops below 20 nm or so, other issues may drive the per-unit cost up. For example, in order to enhance transistor performance, new materials and device structures were implemented. In order to reduce feature size, multiple lithography patterns or EUV (Extreme Ultraviolet Lithography) were used. These process enhancements increase the process cost per wafer, which reduces the benefits of increased yield from increasing the number of dies that can be fabricated on a wafer based on node scaling. Consequently, manufacturing processes need to be improved such that the scaling benefit from decreasing the size of integrated circuit structures overcomes the adverse effects of process enhancements.

SUMMARY

An integrated circuit package and a system including the integrated circuit package as well as a process for assembling the integrated circuit package are provided. The integrated circuit package includes a first die manufactured on a first wafer utilizing a first node size, a second die manufactured on a second wafer utilizing a second node size, and a substrate coupled to the second die at a plurality of bump sites on a bottom surface of the second die. The first die may be mounted on a top surface of the second die utilizing a hybrid wafer bonding technique, micro bumps, or electrodeless plating.

In a first embodiment, the first node size is smaller than the second node size.

In a second embodiment (which may or may not be combined with the first embodiment), the first node size is less than or equal to 16 nm.

In a third embodiment (which may or may not be combined with the first and/or second embodiments), the first die includes a plurality of macroblocks of logic suitable to be implemented at the first node size. The second die includes a plurality of macroblocks of logic suitable to be implemented at the second node size.

In a fourth embodiment (which may or may not be combined with the first, second, and/or third embodiments), the first die includes digital base band logic and the second die includes analog base band logic.

In a fifth embodiment (which may or may not be combined with the first, second, third, and/or fourth embodiments), the first die is mounted to the second die utilizing a wafer hybrid bonding technique. The wafer hybrid bonding technique include: polishing a top surface of the first wafer using a chemical-mechanical planarization (CMP) process; dicing the first wafer to separate a plurality of first dies from the first wafer; polishing a top surface of the second wafer using the CMP process; and placing the plurality of first dies on the top surface of the second wafer such that metal pads in the top surface of the first dies are interfaced with corresponding metal pads in the top surface of the second wafer.

In a sixth embodiment (which may or may not be combined with the first, second, third, fourth, and/or fifth embodiments), the first die includes one or more processing units, a level 2 cache, and a memory controller fabric. The second die includes a level 3 cache. The level 2 cache is configured to transmit a memory request to the level 3 cache in the second die in response to a cache miss in the level 2 cache, and the level 3 cache is configured to transmit a memory request to the memory controller fabric in the first die in response to a cache miss in the level 3 cache.

In a seventh embodiment (which may or may not be combined with the first, second, third, fourth, fifth, and/or sixth embodiments), a first decoupling capacitor is mounted to the substrate and coupled to a supply voltage provided to the second die.

In an eighth embodiment (which may or may not be combined with the first, second, third, fourth, fifth, sixth, and/or seventh embodiments), the second die includes a second decoupling capacitor implemented in the integrated circuits of the second die. A local voltage regulator is included in the second die and configured to generate a regulated voltage coupled to the second decoupling capacitor.

In a ninth embodiment (which may or may not be combined with the first, second, third, fourth, fifth, sixth, seventh, and/or eighth embodiments), the first die includes a dynamic voltage and frequency scaling logic configured to generate a control signal transmitted to the local voltage regulator in the second die.

To this end, in some optional embodiments, one or more of the foregoing features of the aforementioned process, apparatus and/or system may afford an integrated circuit package that, in turn, may improve characteristics of the integrated circuit package, such as by separating logic included in the package between cheap silicon and expensive silicon in order to reduce a cost of the package. It should be noted that the aforementioned potential advantages are set forth for illustrative purposes only and should not be construed as limiting in any manner.

DETAILED DESCRIPTION

One solution to improve yield of wafers manufactured utilizing a small node size is to create packages that combine multiple dies manufactured using different node sizes for different elements of a particular system. For example, a system-on-chip that was conventionally manufactured on a single die utilizing a particular node size could instead be manufactured on two or more dies manufactured on different wafers utilizing different node sizes. Elements on a more expensive wafer utilizing a smaller node size can be limited to the elements of the system-on-chip that benefit from the smaller node size, while other elements can be implemented on a less expensive wafer utilizing a larger node size. As a general example, high density memory, on-chip voltage regulators, and analog circuits may be more amenable to manufacture utilizing a larger node size. Removing these types of elements from dies manufactured utilizing the smaller node size will reduce the die size, and may also increase the yield of the more expensive wafers, thereby reducing the per die cost of the dies utilizing the smaller node size.

While separating a particular system-on-chip into multiple dies has been attempted, these dies are typically mounted on a substrate in a package in a side by side manner. This increases the complexity of the substrate as signals are routed from one die to the other die. In addition, the power dissipation from signal transmission may limit the bandwidth of information that can be transmitted between the dies in this fashion. Therefore, there is a need for improved techniques to create a hybrid approach for system-on-chips manufactured on multiple dies utilizing different node sizes.

Figure 1A:
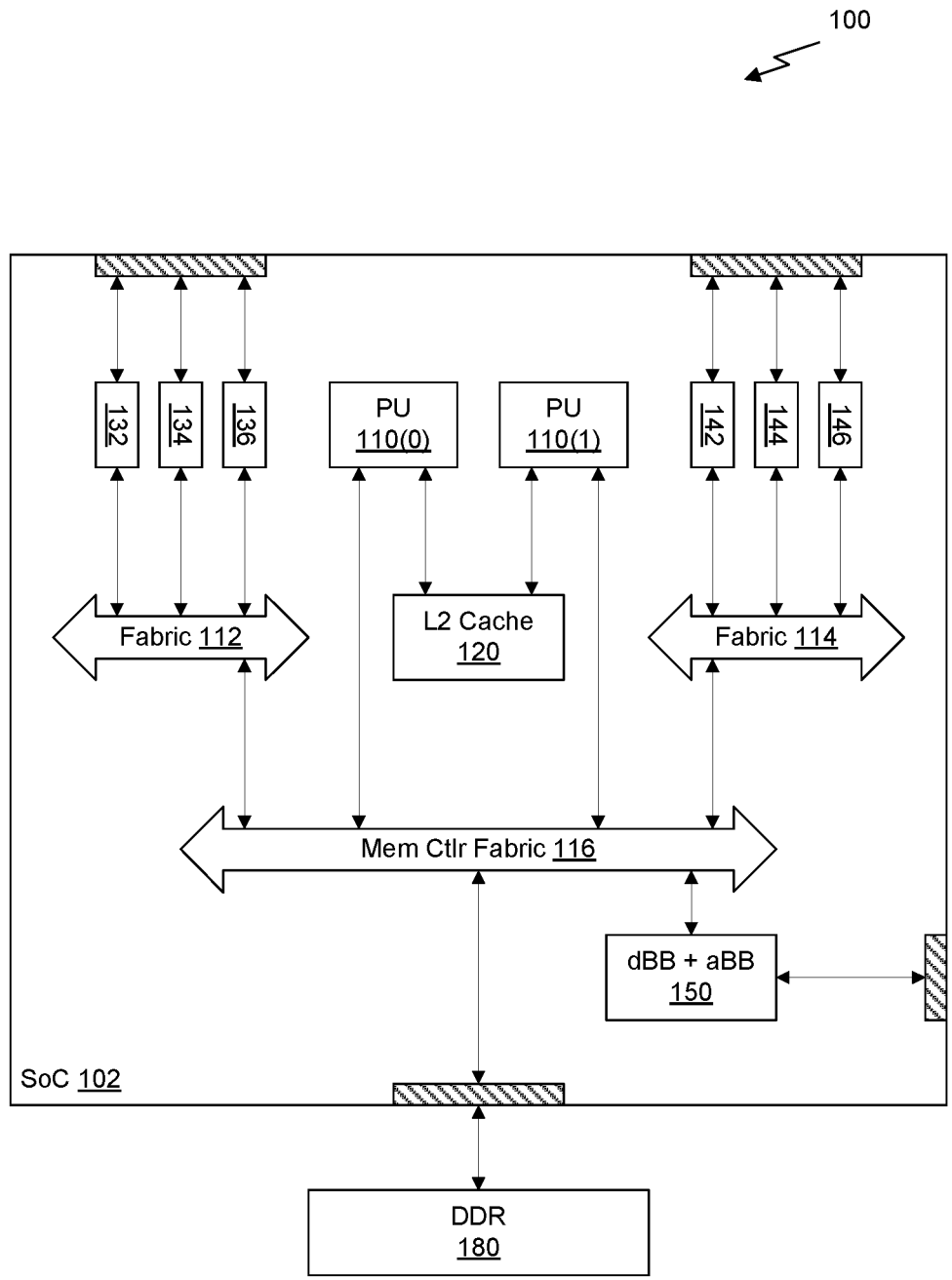
FIG. 1A illustrates a system, in accordance with the prior art.

FIG. 1A illustrates a system 100, in accordance with the prior art. The system 100 includes a system-on-chip (SoC) 102 manufactured utilizing conventional wafer manufacturing technology. The SoC 102 includes a plurality of circuits implemented within an integrated circuit die. The die may include one or more processing units (PUs) 110 coupled to a level 2 (L2) cache 120. The PUs 110 and L2 cache 120 are coupled to a memory controller fabric 116. In one embodiment, the memory controller fabric 116 is a controllable switch network that connects various devices in the SoC 102 to an input/output port coupled to one or more external memory modules 180 (e.g., DDR SDRAM memory modules).

As used herein, an input/output port refers to logic coupled to one or more metal pads on the surface of the die. A solder bump may be placed on each metal pad prior to mounting the die on a substrate. The combination of a metal pad and solder bump may be referred to as a bump site. When a bump site is configured as an input channel, then the electrical signal coupled to the bump site may be isolated from a logic signal for the channel internal to the integrated circuit. The isolation logic may include a diode for limiting input voltage at the pad and/or transistors configured to isolate the external electrical signal from the internal logic signal. When a bump site is configured as an output channel, then a logic signal for the channel internal to the integrated circuit may be used to control a driver for the external electrical signal. The driver may comprise CMOS transistors coupled to a supply bus. It will be appreciated that some bump sites may be configured to be bidirectional (i.e., the logic coupled to the pad can be configured as either an input channel or an output channel), analog, or radio-frequency. The input/output ports are represented as cross-hatched areas on the boundary of the SoC 102.

The SoC 102 also includes various other elements such as a display driver 132, a video codec 134, and an image signal processor 136 coupled to fabric 112 as well as a wireless radio 142, a sensor 144, and one or more additional elements 146 coupled to fabric 114. These elements may be discrete macroblocks of logic implemented in the integrated circuit and may be, e.g., configurable and/or programmable. Each element may be coupled to an input/output port of the SoC 102. The fabrics 112 and 114 may also be connected to the memory controller fabric 116 such that the various elements can read or write data to the memory 180.

The display driver 132 reads pixel data from the memory modules 180 and converts the pixel data into video signals that can be output to a display over a video interface. The video codec 134 may read video data in one format and convert the video data into another format. The image signal processor 136 may receive image data from an image sensor coupled to an input port on the SoC 102 and store the image data in a particular file format in the memory 180. The wireless radio 142 may read data symbols from a buffer and convert the data symbols to a wireless signal to be transmitted over an antenna coupled to an output port of the SoC 102. Alternatively, the wireless radio 142 may receive a wireless signal from an antenna coupled to an input port of the SoC 102 and convert the wireless signal to a series of data symbols. The sensor 144 may be a temperature sensor embedded within the SoC 102, or could be logic for reading and analyzing data received from an external sensor coupled to an input port of the SoC 102. Of course, the additional element(s) 146 may be any other additional macroblocks of logic well known in the art to be included in conventional SoCs.

The SoC 102 also includes a digital base band (dBB) logic that is coupled to an analog base band (aBB) logic that is coupled to an input/output port (aBB+dBB 150). The dBB+aBB logic 150 may include analog circuits coupled to one or more input/output ports tied to analog signals. Unlike digital input/output ports, the pads for an analog input/output port are coupled to logic for reading or generating analog signals rather than digital signals. For example, the logic of an analog input channel may couple the external electrical signal to an analog to digital converter (ADC) to convert the analog level of the electrical signal to a digital value; and the logic of an analog output channel may generate an analog signal based on a digital value provided as an input to a digital to analog converter (DAC). Of course, the logic of an analog input/output channel may also utilize diodes or other circuit protection means to limit the voltage at the pad for circuit protection. The aBB logic may include various circuits designed to work with analog signals. The aBB logic may also include comparators and/or ADC to convert an analog signal into a digital signal, such that the digital signal can be processed by the dBB logic. The dBB logic may be coupled to the memory controller fabric 116 such that digital values can be stored in the memory 180 and/or transmitted to the processing units 110 or other elements for processing.

Figure 1B:
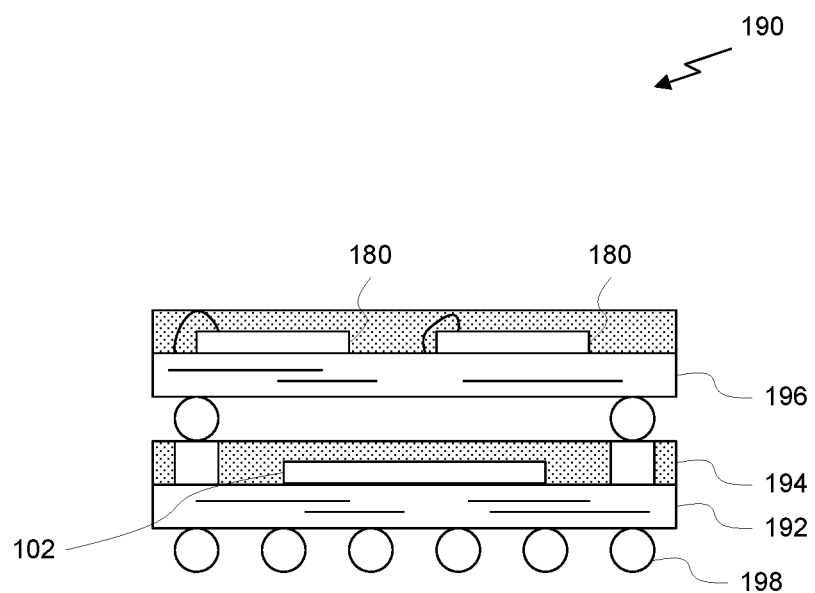
FIG. 1B illustrates an assembly including the SoC of FIG. 1A, in accordance with the prior art.

FIG. 1B illustrates an assembly 190 including the SoC 102 of FIG. 1A, in accordance with the prior art. The assembly 190 may be referred to as a package-on-package (PoP). As shown in FIG. 1B, the die for the SoC 102 is mounted to a substrate 192 and encapsulated in a molding material 194 to assemble a first package. The bump sites on the die of the SoC 102 connect the input/output ports of the SoC 102 to external signals, which may be routed off the first package via a ball grid array (BGA) containing solder balls 198 or to one or more additional packages stacked on top of the first package. As shown in FIG. 1B, a second package may include one or more dies for the memory 180 mounted to a substrate 196.

It will be appreciated that as the node size decreases, some circuits may exhibit operational behavior that is unexpected. For example, as the node size shrinks below 20 nm or so, impurities in the semiconductor substrate and/or non-uniformity of deposition layers may become more of an issue as a particular impurity or small change in thickness at a specific structure becomes a larger and larger percentage of the structure. In addition, as node size decreases below 20 nm or so, quantum effects may become an issue that causes failures in various devices.

As a wafer is processed, the dies on the wafer will be tested, and some dies may be rejected when they do not pass testing. The percentage of dies that are acceptable on a wafer is referred to as yield. As node size decreases, the same die design may be created in a smaller footprint on the wafer, enabling more dies to be fabricated on a single wafer. However, at really small node sizes, the yield of the wafer may decrease because of high defect density and the complexity of the fabrication processes at the smaller node size.

Some circuits do not scale as effectively as others. For example, analog and radio-frequency circuits do not scale in the same way as digital circuits (e.g., CMOS) as the node size decreases. Consequently, one solution to these issues is to split the SoC 102 into two different dies manufactured on different wafers, and then combine the dies in a single package using a substrate to route signals between the dies.

Figure 2A:
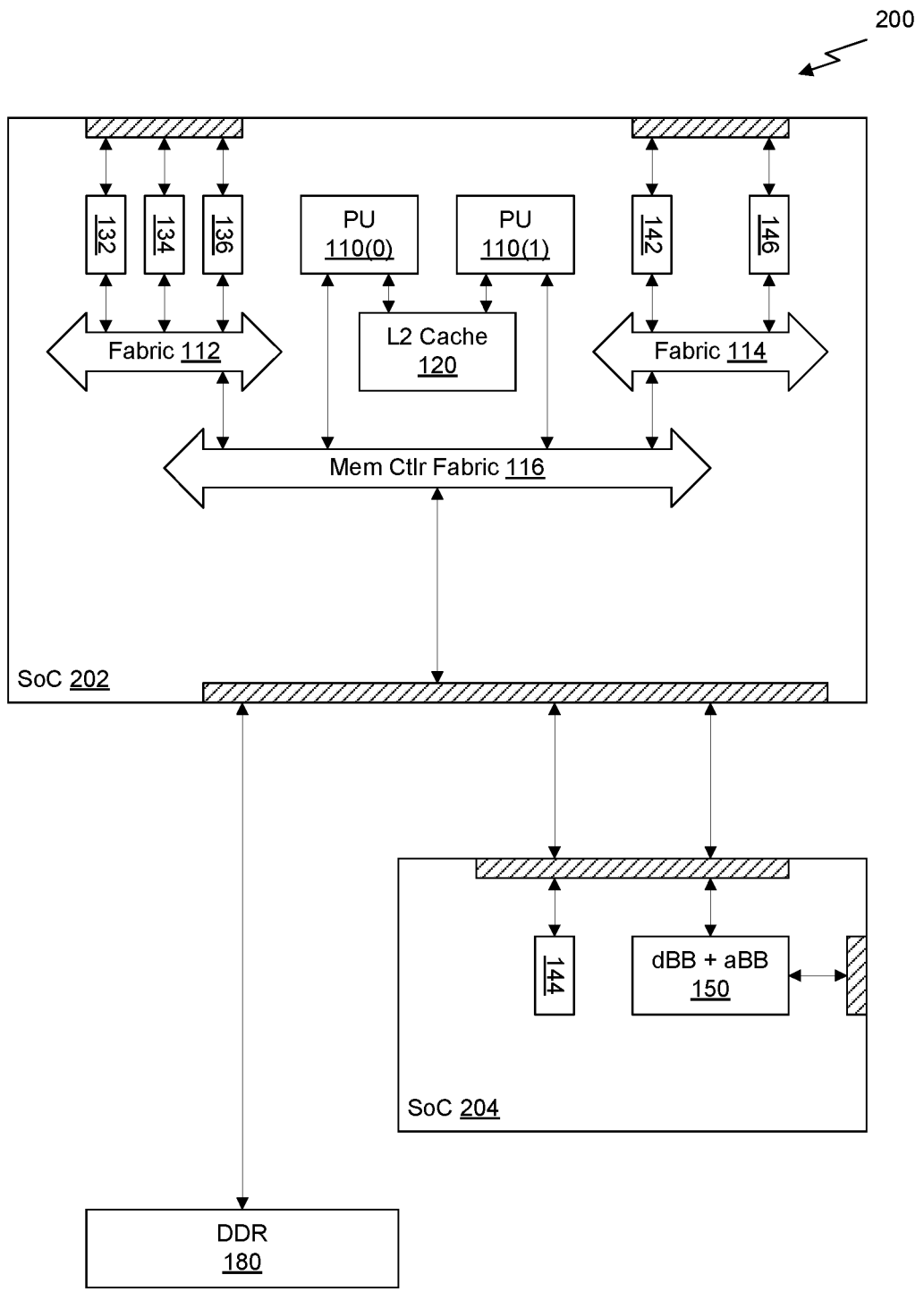
FIG. 2A illustrates a system, in accordance with the prior art.

FIG. 2A illustrates a system 200, in accordance with the prior art. The system 200 includes a first SoC 202 manufactured using a small node size, a second SoC 204 manufactured using a large node size, and one or more memory modules 180. The first SoC 202 may include various elements of SoC 102 that are less prone to failure at the smaller node size of manufacture. For example, the first SoC 202 may include the processing units 110(0) and 110(1), the L2 cache 120, the memory controller fabric 116, other elements such as a display driver 132, a video codec 134, and an image signal processor 136 coupled to fabric 112 as well as a wireless radio 142, and one or more additional elements 146 coupled to fabric 114. The memory controller fabric 116 is coupled to an input/output port that is coupled to one or more memory modules 180.

The second SoC 204 may include various elements of SoC 102 that are not cost effective at the smaller node size of manufacture, but may be better suited to be manufactured using a larger node size. For example, the second SoC 204 may include the dBB+aBB logic 150 and the sensor 144.

It will be appreciated that which elements are included in the first SoC 202 and which elements are included in the second SoC 204 may be determined based on the element design (i.e., the specific structures implemented in the integrated circuits of the element) and may be affected by process parameters, quality control during wafer processing, and cost. For example, the moving some macroblocks of logic from the first SoC 202 to the second SoC 204 may lower the cost of the overall chip set compared with a single SoC 102. Consequently, identification of the particular elements to be placed on the second die 204 rather than the first die 202 is a matter of design.

Figure 2B:
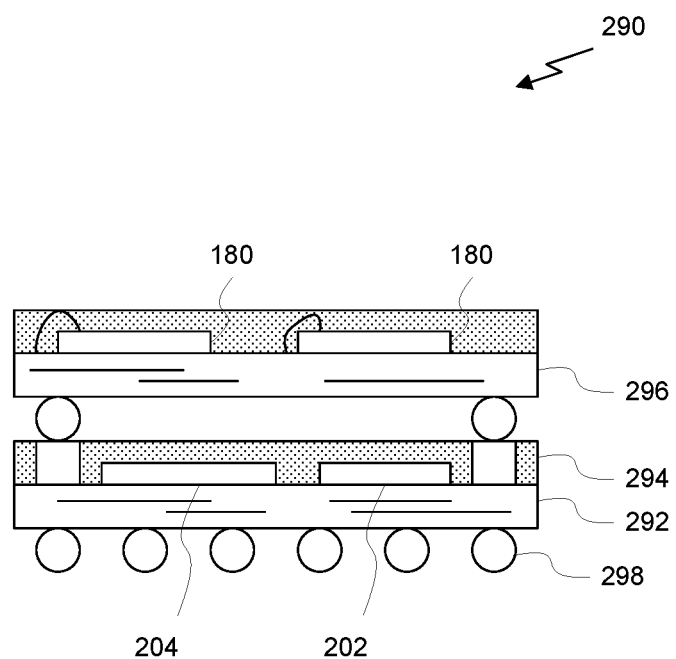
FIG. 2B illustrates an assembly including the first SoC and second SoC of FIG. 2A, in accordance with the prior art.

FIG. 2B illustrates an assembly 290 including the first SoC 202 and second SoC 204 of FIG. 2A, in accordance with the prior art. The assembly 290 may be referred to as a package-on-package (PoP) assembly. As shown in FIG. 2B, the dies for the first SoC 202 and second SoC 204 are mounted to a substrate 292 and encapsulated in a molding material 294 to assemble a first package. The bump sites on the dies of the first SoC 202 and second SoC 204 connect the input/output ports of the first SoC 202 and second SoC 204 to external electrical signals, which may be routed off the first package via a ball grid array (BGA) containing solder balls 298 or to one or more additional packages stacked on top of the first package. As shown in FIG. 2B, a second package may include one or more dies for the memory 180 mounted to a substrate 296 and encapsulated within a molding material similar to molding material 294.

The substrate 292 is much more complicated than the substrate 192 as signals not only need to be routed from a single die to the BGA and/or the additional packages stacked on top of the first package, but signals now need to be routed from the first SoC 202 to the second SoC 204 mounted side by side on the substrate 292. In addition, it will be appreciated that power is dissipated when driving signals from one die to another die due to the parasitic capacitance and inductance of the interconnects and solder bumps used for these signal traces between the dies. The bandwidth on these external signal traces may be less than comparable interconnects between elements internal to a single die, such as SoC 102. Thus, it would be beneficial to find solutions to this issue and/or other issues associated with mounting the dies 202/204 side by side on a substrate of a fanout wafer level package.

Figure 3:
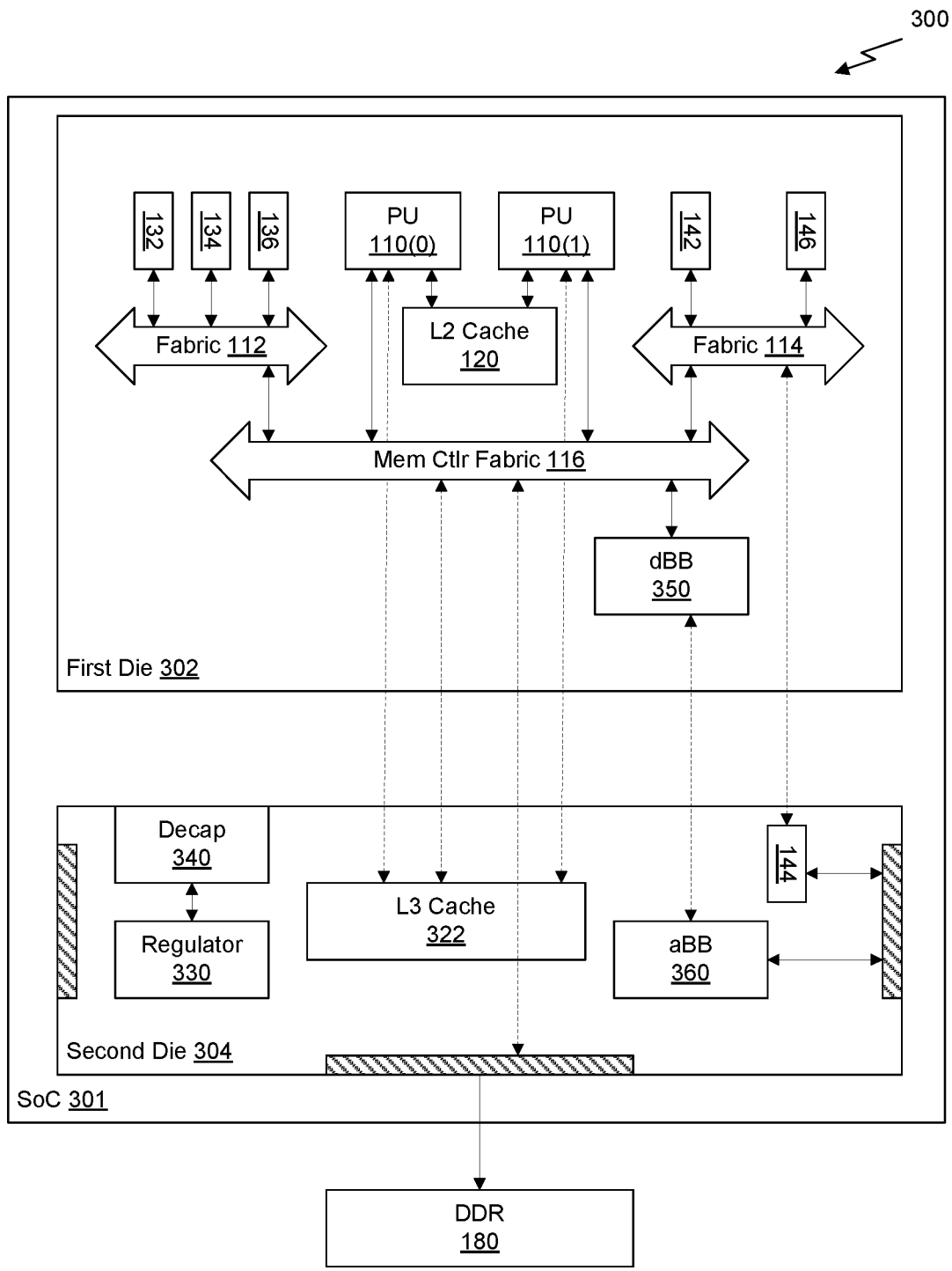
FIG. 3 illustrates a system including a heterogenous chip stack for a mobile processor, in accordance with one embodiment.

FIG. 3 illustrates a system 300 including a heterogenous chip stack for a mobile processor, in accordance with one embodiment. As shown in FIG. 3, the elements of the SoC 301 may be divided into a plurality of dies: a first die 302 that includes elements in a top tier (i.e. layer) of the chip stack, and a second die 304 that includes elements in a bottom tier (i.e. layer) of the chip stack. As used herein, a chip stack refers to a plurality of integrated circuit dies stacked (i.e. vertically connected) via an interface. The first die 302 is formed on a first wafer manufactured utilizing a first node size, and the second die 304 is formed on a second wafer manufactured utilizing a second node size, where the first node size is smaller than the second node size. In one embodiment, the first node size is less than or equal to 14 nm and the second node size is greater than 14 nm.

In one embodiment, the first die 302 includes various elements such as the processing units 110, the L2 cache 120, and the memory controller fabric 116. The first die 302 may also include other elements such as a display driver 132, a video codec 134, and an image signal processor 136 coupled to fabric 112 as well as a wireless radio 142, and one or more additional elements 146 coupled to fabric 114. The first die 302 may also include the dBB logic 350 portion of the aBB+dBB logic 150.

Unlike the first SoC 202, the first die 302 does not include any input/output ports. Instead, internal signals from the various elements in the first die 302 are routed to the second die 304 via pads connected to corresponding pads on the second die 304. In other words, the pads are not associated with logic like typical input/output ports on the SoC 102 or SoC 202 to isolate an input signal or drive an output signal. Instead, the pads just act as an interface to conductively couple interconnects in one die to interconnects in another die. The signals routed between the first die 302 and the second die 304 are represented as dashed lines.

In one embodiment, output pads on the first die 302 are coupled to a buffer included in the first die 302 used to drive the signal coupled to corresponding pads on the second die 304. These pads on the first die 302 are not coupled to a conventional I/O driver logic (which typically may provide for higher current (source or sink), provide for ESD protection, etc.) in order to reduce the power at the interface between the first die 302 and the second die 304. The corresponding pads included in the second die 304 are coupled to protection circuitry (e.g., RC filters, suppressors, diodes, etc.) in the second die 304 that also protect the circuits in the first die 302 from ESD or other dangerous electrical conditions. In other words, the signals transmitted from the first die 302 to the second die 304 or from the second die 304 to the first die 302 are being interconnected with a known electrical environment and, therefore, the requirements for the I/O driver in the first die 302 may be reduced to save power.

The second die 304 may include various elements of SoC 102 that are better suited to be manufactured using a larger node size. For example, the second die 304 may include the sensor 144 and the aBB logic portion 360 of the dBB+aBB logic 150. The second die 304 may also include a level 3 (L3) cache 322, which is part of a memory hierarchy including the memory modules 180, the L2 cache 120, and any level 1 (L1) caches inside the PUs 110. As discussed in further detail below, the second die 304 may also include a local voltage regulator 330, such as a low dropout (LDO) regulator, and a decoupling capacitor 340.

All of the input/output ports for both the first die 302 and the second die 304 are located on the second die 304. In one embodiment, the second die 304 includes pads on a top layer of the second die 304. These pads are connected to corresponding pads on the top layer of the first die 302 to create an interface for internal logic signals passed between the first die 302 and the second die 304. The second die 304 may also include pads on a first layer of the second die 304. The first layer may refer to the first metal layer deposited on a silicon substrate when forming the integrated circuits on the second die 304. Through silicon vias (TSVs) are then used to connect the pads in the first layer to a bottom surface of the second die 304 such that bump sites on the bottom layer of the second die 304 can be connected to the external electrical signals of the input or output channels.

In one embodiment, the second die 304 may include one or more local voltage regulators 330, such as a low dropout (LDO) regulator implemented within the integrated circuit of the second die 304. A power supply voltage supplied to the second die 304 through one or more of the input/output ports is connected to the local voltage regulator 330 in the second die 304 to generate a regulated voltage. The regulated voltage is then passed as a power supply voltage to the first die 302 via the interface between the dies. In one embodiment, the regulated voltage is output via an input/output port to an inductor. The output of the inductor is then passed back through a second input/output port and coupled to the decoupling capacitor 340 before being passed as a power supply voltage to the first die 302. It will be appreciated that the local voltage regulator 330 may be cheaper to implement at the large node size of the second die 304 rather than the small node size of the first die 302.

In one embodiment, the first die 302 may include a dynamic voltage and frequency scaling (DVFS) logic block. The DVFS logic block generates a control signal for the local voltage regulator in the second die 304, and the control signal is routed from the first die 302 to the second die 304 via the interface between the first die 302 and the second die 304. The control signal adjusts the local voltage regulator 330 to change the regulated voltage supplied to the first die 302. Consequently, the first die 302 can operate in a low power mode by decreasing a regulated voltage supplied to the first die 302 and/or decreasing a frequency at which the first die 302 operates.

In one embodiment, a decoupling capacitor 340 is implemented in the second die 304. The decoupling capacitor 340 is connected to the local voltage regulator 330 or a power supply from the substrate. The decoupling capacitor 340 may be implemented directly in the integrated circuits of the second die 304, which support AC power requirements for both the first die 302 and the second die 304.

In one embodiment, a memory hierarchy is implemented across both the first die 302 and the second die 304. For example, each PU 110 may include an L1 cache. A cache miss in the L1 cache may result in a memory request being transmitted from the PU 110 to a larger L2 cache 120 in the first die 302. A cache miss in the L2 cache 120 may result in a memory request being transmitted from the L2 cache 120 to a larger L3 cache 322 in the second die 304. The L3 cache 322 can be a high density memory that is more difficult or costly to implement at the smaller node size of the first die 302. However, the high density memory may be cheaper to produce at the larger node size of the second die 304. Consequently, while the L3 cache 322 would be difficult to implement in the first die 302 (e.g., yield could be decreased significantly thereby increasing the cost of each of the first dies 302 significantly), the L3 cache 322 may be implemented much more cheaply in the second die 304. In various embodiments, the L3 cache 322 may be implemented as low leakage SRAM, embedded dynamic random access memory (eDRAM), thyristor DRAM, or magnetoresistive random access memory (MRAM). In addition, the L3 cache 322 directly implemented in the second die 304 may also reduce access latency of the system 300.

It will be appreciated that the L3 cache 322 may not be coupled directly to the input/output ports of the second die 304. More specifically, the L2 cache 120 and the L3 cache 322 may both utilize the memory controller fabric 116 to transmit memory access requests to the external memory modules 180. The memory controller fabric 116 is connected, via the interface between the dies, to an input/output port of the second die 304. A memory access request generated by the L3 cache 322 is transmitted to the memory controller fabric 116 in the first die 302 and routed back to the input/output port of the second die 304 to be sent to the external memory module 180. In one embodiment, the PUs 110 (or the L1 caches inside each of the PUs 110) are coupled directly to the L3 cache 322, such that the PUs 110 can access the L3 cache 322 directly in some instances, bypassing the L2 cache 120.

In one embodiment, metal layers in the second die 304 may be implemented as a form of shielding to reduce interference from signals in the first die 302. For example, the aBB logic portion 360 in the second die 304 may be implemented below a metal layer in the second die 304. The metal layer may be connected to a ground potential and act as a Faraday cage to reduce interference with signals in the logic portion 360. Similarly, a metal layer in the first die 302 may also be implemented as a form of shielding to reduce interference from signals in the second die 304. For example, a dBB logic portion 350 in the first die 302 may be implemented below a metal layer in the first die 302. When the first die 302 is flipped and mounted to the second die 304, the grounded metal layers between the aBB logic portion 360 and the dBB logic portion 350 may act as a form of shielding to reduce interference in the aBB logic portion 360 and the dBB logic portion 350, respectively.

Figure 4A:
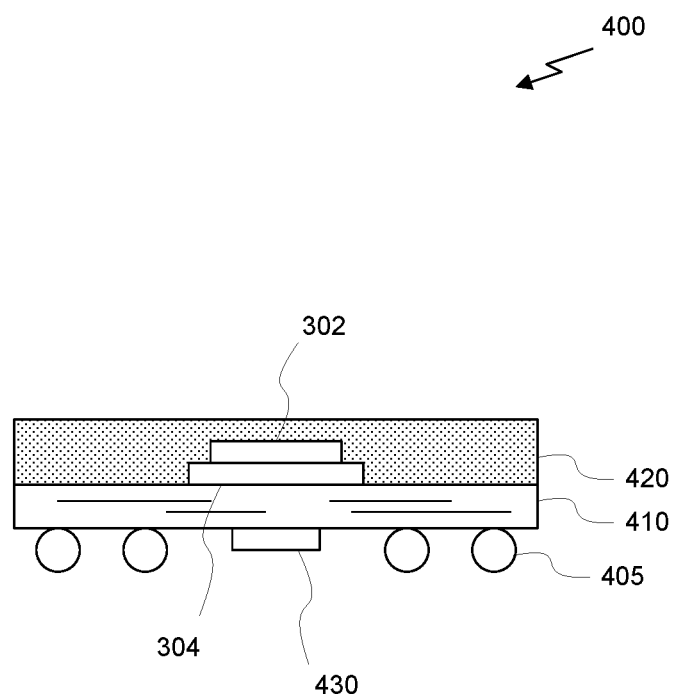
FIG. 4A illustrates an integrated circuit (IC) package, in accordance with one embodiment.

FIG. 4A illustrates an integrated circuit (IC) package 400, in accordance with one embodiment. The IC package 400 includes the first die 302 and the second die 304. It will be appreciated that the first die 302 is flipped and mounted on the second die 304. The second die 304 is mounted to a substrate 410 at a plurality of bump sites associated with the input/output ports of the second die 304. A plurality of solder balls 405 may be attached to the bottom surface of the substrate 410 to implement, e.g., a ball grid array (BGA) for coupling the IC package 400 to a printed circuit board. The first die 302 and second die 304 may also be encapsulated in a molding material 420.

In one embodiment, the mounting technique used to connect the first die 302 to the second die 304 is a die-to-wafer (D2 W) bonding technique. One of the techniques for D2 W bonding is a hybrid bonding technique that uses a natural property of pure metal surfaces to bond the first die 302 to the second die 304. In another embodiment, the mounting technique could be achieved through micro bumps or electrode-less plating to connect the pads between the first die 302 and the second die 304.

More specifically, a first wafer is manufactured utilizing a small node size, the first wafer containing a plurality of first dies 302. The wafer may be polished to ensure a flat surface on the top layer of the first dies 302, and then the wafer is diced to separate each of the individual dies 302 from the wafer. A second wafer is manufactured utilizing a large node size, the second wafer containing a plurality of second dies 304. The second wafer may be polished to ensure a flat surface on the top layer of the second dies 304. The separated dies 302 are then placed, metal pads down, onto the second wafer such that metal pads on the top surface of the first dies 302 bond to corresponding metal pads on the top surface of the second dies 304 on the second wafer. After a plurality of first dies 302 are bonded to the second wafer, a wafer level fill or molding material may be used to encapsulate the first dies 302 on the wafer, and then the second wafer may be diced to separate each corresponding pair of first dies 302 and second dies 304, which may be mounted on a substrate 410.

In one embodiment, a decoupling capacitor 430 may be connected to the substrate 410 near the second die 304 to isolate the second die 304 from any noise on the power supply voltage signal supplied to the second die 304. A second decoupling capacitor (e.g., decoupling capacitor 340) may be implemented in the second die 304 that is connected to the regulated voltage from the local voltage regulator or the power supply from the substrate/decoupling capacitor 430. As the regulated voltage is already isolated from external noise in the power supply signal by the first decoupling capacitor 430 mounted on the substrate 410, the second decoupling capacitor may be much smaller than the first decoupling capacitor 430 and, therefore, can be implemented in the integrated circuit elements of the second die 304 rather than embedded into the first die 302, which will reduce the overall cost of the chip set.

It will be appreciated that stacking dies is well-known in the prior art. For example, stacked dies interconnected with peripheral wire-bonds and memory stacks connected using through-silicon vias (TSV) are two common applications utilizing stacked dies. Because node size typically dictates standard pad size and pad spacing, bonding dies manufactured using a first node size to a wafer manufactured using a second node size requires special consideration in design to adjust the size and/or spacing of standard pads for each of the dies on the two wafers. For example, standard spacing or pitch between metal pads on the surface of the die may need to be adjusted such that the pads align.

Figure 4B:
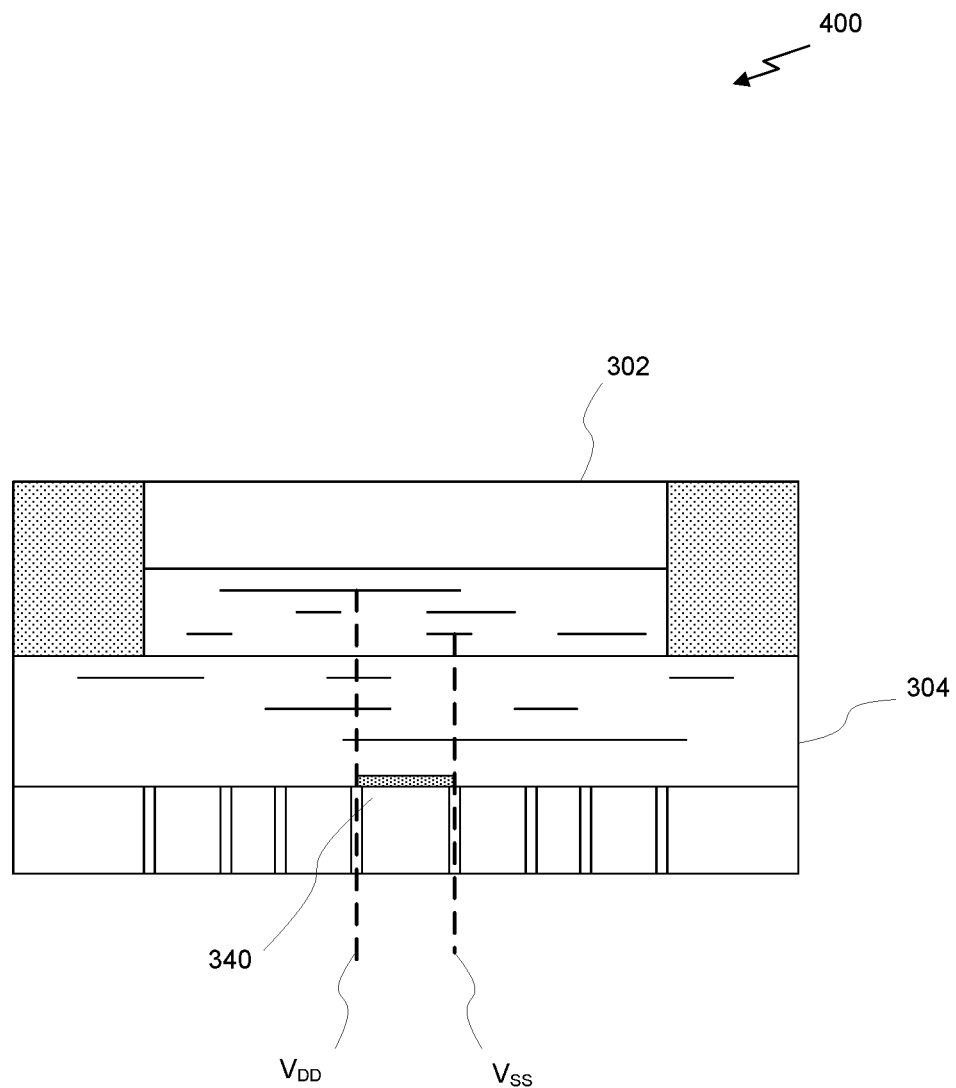
FIG. 4B illustrates the integrated circuit (IC) package, in accordance with another embodiment.

FIG. 4B illustrates an integrated circuit (IC) package 400, in accordance with another embodiment. As shown in FIG. 4B, in one embodiment, the decoupling capacitor 340 for the first die 302 is implemented in the silicon of the second die 304. The decoupling capacitor 340 can be attached to the power distribution network for the first die 302 such that a minimum decoupling capacitor required by the first die 302 can be cheaply implemented within the second die 304. In addition, a thick metal layer may be placed on the backside of the second die 304 in order to spread power entering the second die 304 through the power distribution network.

In one embodiment, the decoupling capacitor 340 is coupled to a regulated voltage from a voltage regulator implemented in the silicon circuits of the second die 302. In other words, an off-chip power supply generates a $V_{DD}$ supply and couples the $V_{DD}$ supply to the second die 304 via, e.g., a through-silicon via (TSV). The $V_{DD}$ supply is coupled to a voltage regulator in the second die 304, which produces a regulated voltage that is then coupled to the decoupling capacitor 340 in the second die. The regulated voltage coupled to the decoupling capacitor 340 is then coupled to the first die 302 via an interface between the first die 302 and the second die 304.

Figure 4C:
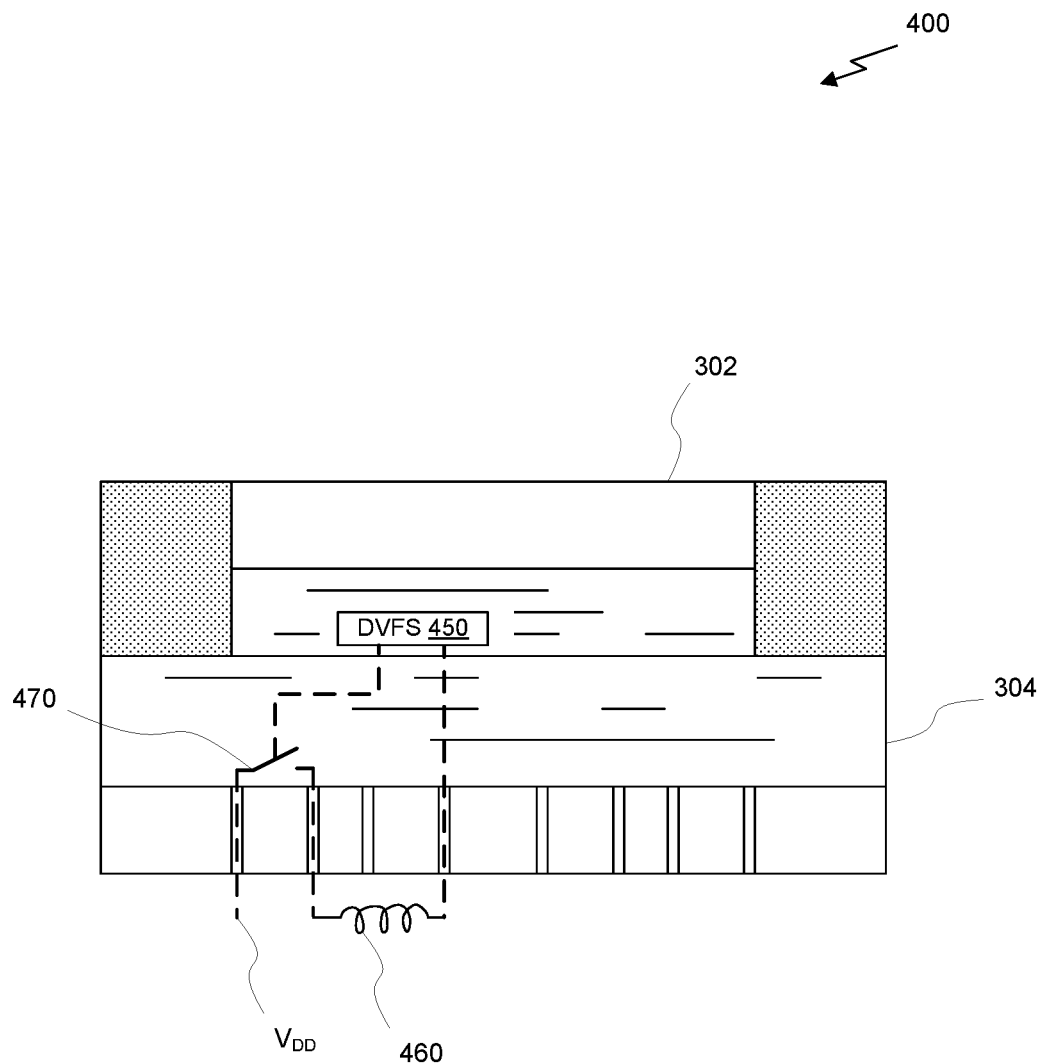
FIG. 4C illustrates the integrated circuit (IC) package, in accordance with yet another embodiment.

FIG. 4C illustrates an integrated circuit (IC) package 400, in accordance with yet another embodiment. As shown in FIG. 4C, in one embodiment, the second die 304 may include a voltage regulator 470, such as a low-dropout regulator, that is utilized to generate a regulated voltage supplied to the power distribution network of the first die 302. The positive power supply may be supplied to a circuit in the second die 304 through a through-silicon via (TSV) that is coupled to a voltage regulator 470. The regulated voltage may then be routed out another TSV to an inductor 460, which may be, e.g., mounted to the substrate 410 near the second die 304. The regulated voltage from the other end of the inductor is then routed back on chip through a third TSV and then routed to the interface between the first die 302 and the second die 304. The regulated voltage may power, among other circuits in the first die 302, a dynamic voltage and frequency scaling (DVFS) unit 450 in the first die 302, which can be used to scale the regulated voltage output of the voltage regulator 470 in the second die 304. It will be appreciated that the low cost silicon of the second die 304 implements the voltage regulator 470, while the DVFS unit 450 in the high cost silicon of the first die 302 implements the power control circuit. In addition, the in-stack power control provided between the first die 302 and the second die 304, without requiring the power control signals to be routed off package to a separate PMIC unit, enables extremely fast response times.

Figure 5A:
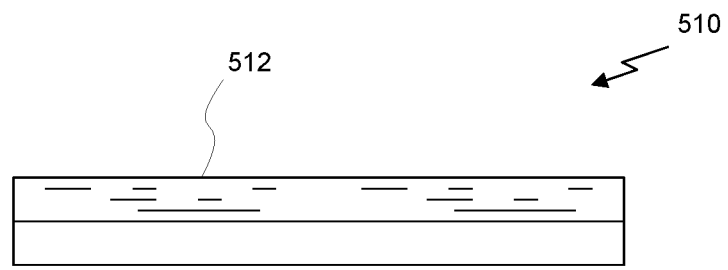
FIGS. 5A-5F illustrate a technique for fabricating the package of FIG. 4, in accordance with one embodiment.

FIGS. 5A-5F illustrate a technique for fabricating the IC package 400 of FIG. 4A, in accordance with one embodiment. As shown in FIG. 5A, a first wafer 510 is manufactured utilizing a small node size. The first wafer 510 includes a plurality of first dies 302. A top layer 512 of the first wafer 510 includes metal pads (e.g., copper pads). The first wafer 510 may be polished using a chemical-mechanical planarization (CMP) process to create a flat surface on the top layer 512 of the first wafer. The first wafer 510 may then be diced to separate each of the first dies 302.

Figure 5B:
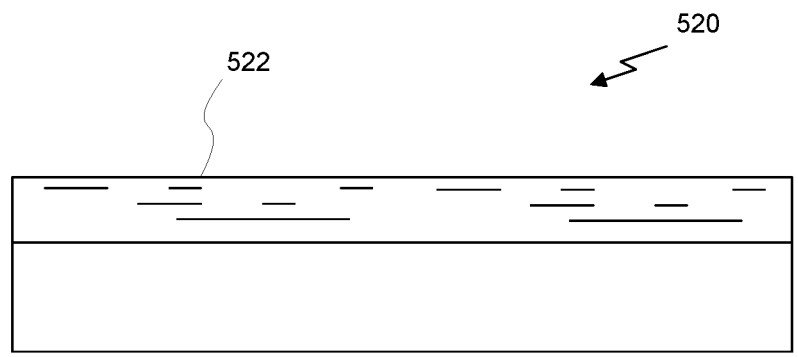

As shown in FIG. 5B, a second wafer 520 is manufactured utilizing a large node size. The second wafer 520 includes a plurality of second dies 304. A top layer 522 of the second wafer 520 includes metal pads (e.g., copper pads). The second wafer 520 may be polished using a chemical-mechanical planarization (CMP) process to create a flat surface on the top layer 522 of the second wafer 520.

Figure 5C:
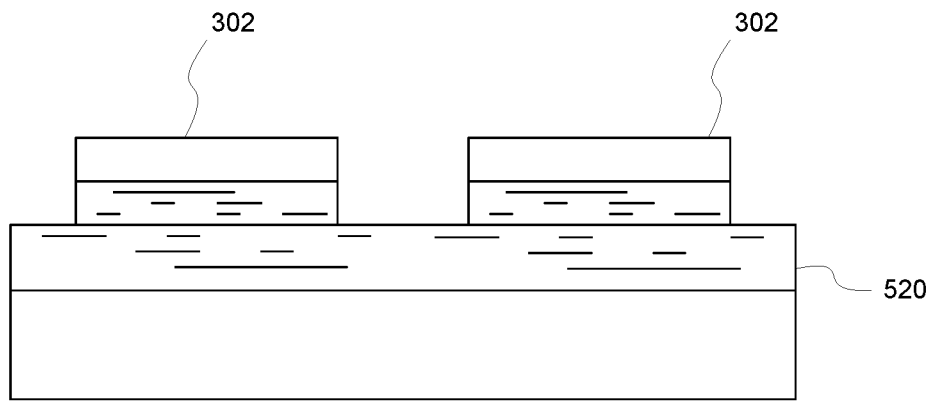

As shown in FIG. 5C, a plurality of first dies 302 are mounted to the second wafer 520 utilizing a D2W hybrid bonding technique. Again, in the D2W hybrid bonding technique, the first dies 302 are flipped and placed top layer 512 down onto the top layer 522 of the second wafer 520 such that metal pads on the first dies 302 align with corresponding metal pads of the second dies 304 in the second wafer 520. The pads bond directly at an interface between corresponding pads, forming a connection between the dies. In another embodiment, the die-to-die interface could be formed via micro bumps with solder (i.e., solder bumps having a pitch less than 20 µm) or through electrode-less plating.

Figure 5D:
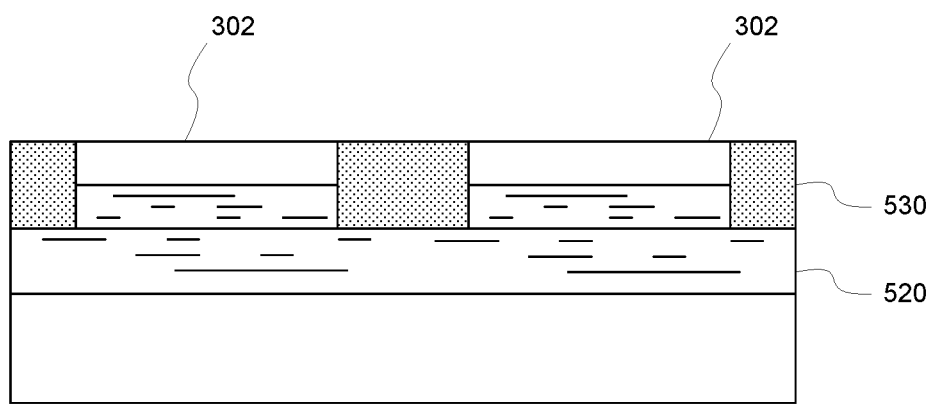

As shown in FIG. 5D, a wafer level fill is utilized to encapsulate the first dies 302 mounted to the second wafer 520. The wafer level fill may be a molding material 530, such as an epoxy resin composite with filler material.

Figure 5E:
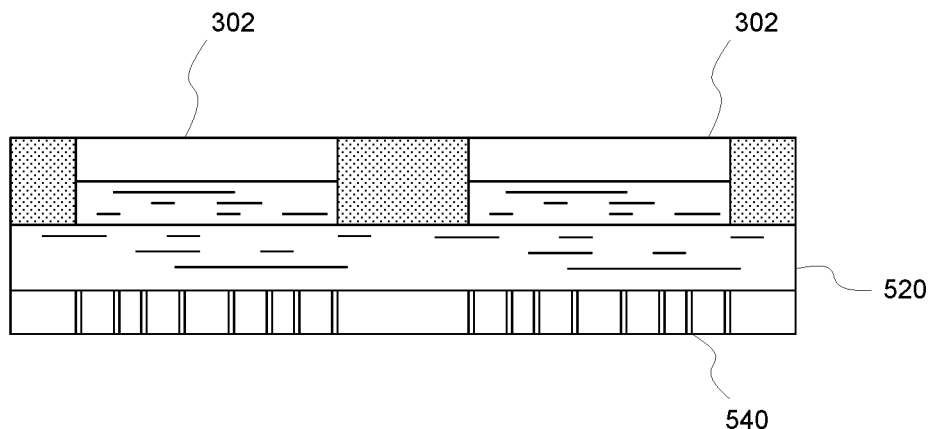

As shown in FIG. 5E, the second wafer 520 may be thinned by using, e.g. mechanical grinding, CMP, wet etching, atmospheric downstream plasma (ADP) dry chemical etching (DCE), and the like. The second wafer 520 is thinned because larger wafer sizes may be used to manufacture the second wafer 520, and the larger wafer sizes require a thicker silicon substrate. However, thin dies may be the goal to reduce package thickness. One technique for thinning the die is to reduce the thickness of the back side of the dies after the integrated circuits have been formed on the top layer of the wafer. After thinning, through silicon vias (TSVs) 540 may be formed in the bottom layer of the second dies 304 in the second wafer 520.

Figure 5F:
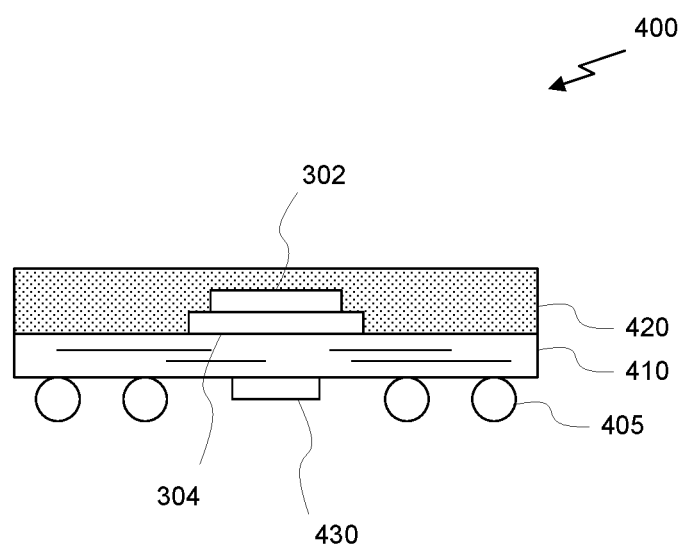

As shown in FIG. 5F, the second wafer 520 is then diced to separate the individual second dies 304. It will be appreciated that each second die 304 has a corresponding first die 302 mounted thereto, and that the first die 302 is encapsulated in the molding material 530. The second die is then mounted on a substrate 410, via bump sites formed on pads corresponding to each TSV 540 on the bottom surface of the second die 304. Solder balls 405 are added to the bottom side of the substrate 410, and the first die 302 and second die 304 are further encapsulated in a molding material 420. In addition, a decoupling capacitor 430 may be mounted to a bottom surface of the substrate 410. It will be appreciated that, in some embodiments, the IC package 400 may be stacked with one or more additional other packages to create a PoP assembly.

Figure 6:
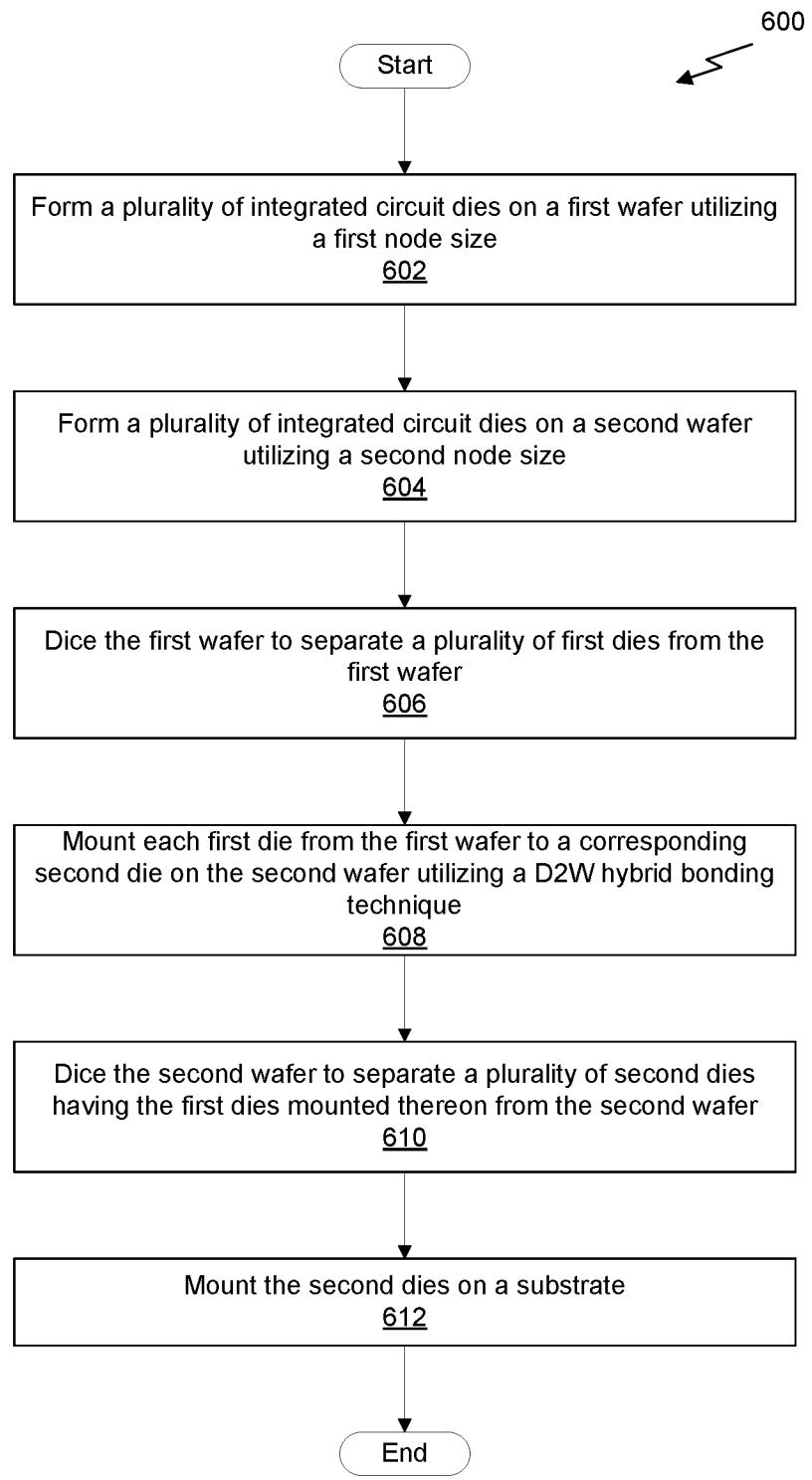
FIG. 6 is a flowchart of a method for assembling an integrated circuit package, in accordance with one embodiment.

FIG. 6 is a flowchart of a method 600 for assembling an integrated circuit package, in accordance with one embodiment. The method 600 may be performed by hardware, or a combination of hardware and software, on one or more specialized machines. In one embodiment, the method 600 is implemented, at least in part, by silicon wafer processing machinery.

At step 602, a plurality of integrated circuit dies are formed on a first wafer 510 utilizing a first node size. In one embodiment, the first node size may be associated with a small node size such as a node size less than or equal to 16 nm. The integrated circuits formed on the first wafer 510 may include various macroblocks of logic, at least some of the macroblocks including advanced node core transistors.

At step 604, a plurality of integrated circuit dies are formed on a second wafer 520 utilizing a second node size. The second node size may be associated with a large node size such as a node size greater than 14 nm. The integrated circuits formed on the second wafer 520 may include bipolar junction transistors (BJT), capacitors, embedded memory, etc.

At step 606, the first wafer 510 is diced to separate a plurality of first dies 302 from the first wafer 510. In one embodiment, a CMP process is utilized to flatten a top surface 512 of the first wafer 510 prior to dicing.

At step 608, each first die 302 from the first wafer 510 is mounted to a corresponding second die 304 on the second wafer 520 utilizing a D2W bonding technique. In one embodiment, a CMP process is utilized to flatten a top surface 522 of the second wafer 520 prior to mounting the first dies 302 to the second dies 304. In one embodiment, the die-to-die interface could be formed via micro bumps with solder (i.e., solder bumps having a pitch less than 20 µm) or through electrode-less plating.

At step 610, the second wafer is diced to separate a plurality of second dies 304 from the second wafer 520. It will be appreciated that each second die 304 has a corresponding first die 302 mounted thereto. In one embodiment, prior to dicing the second wafer 520, a wafer level fill step is completed to encapsulate the plurality of first dies 302 in a molding material. Thus, the first dies 302 will be at least partially encapsulated in a molding material on top of the second dies 304 after the second wafer 520 is diced.

At step 612, each second die 304 is mounted to a substrate 410. In one embodiment, bump sites may be formed on a bottom surface of the second die 304 prior to dicing the second wafer 520. The second die 304 is then placed on a wafer fanout substrate 410 that includes a number of redistribution layers to route signals from the bump sites on the bottom surface of the second die 304 to pads on a bottom surface of the substrate 410 at locations of solder balls 405 of a BGA. The first die 302 and second die 304 may also be further encapsulated on the substrate 410 by additional molding material 420 to form the IC package 400.

Figure 7:
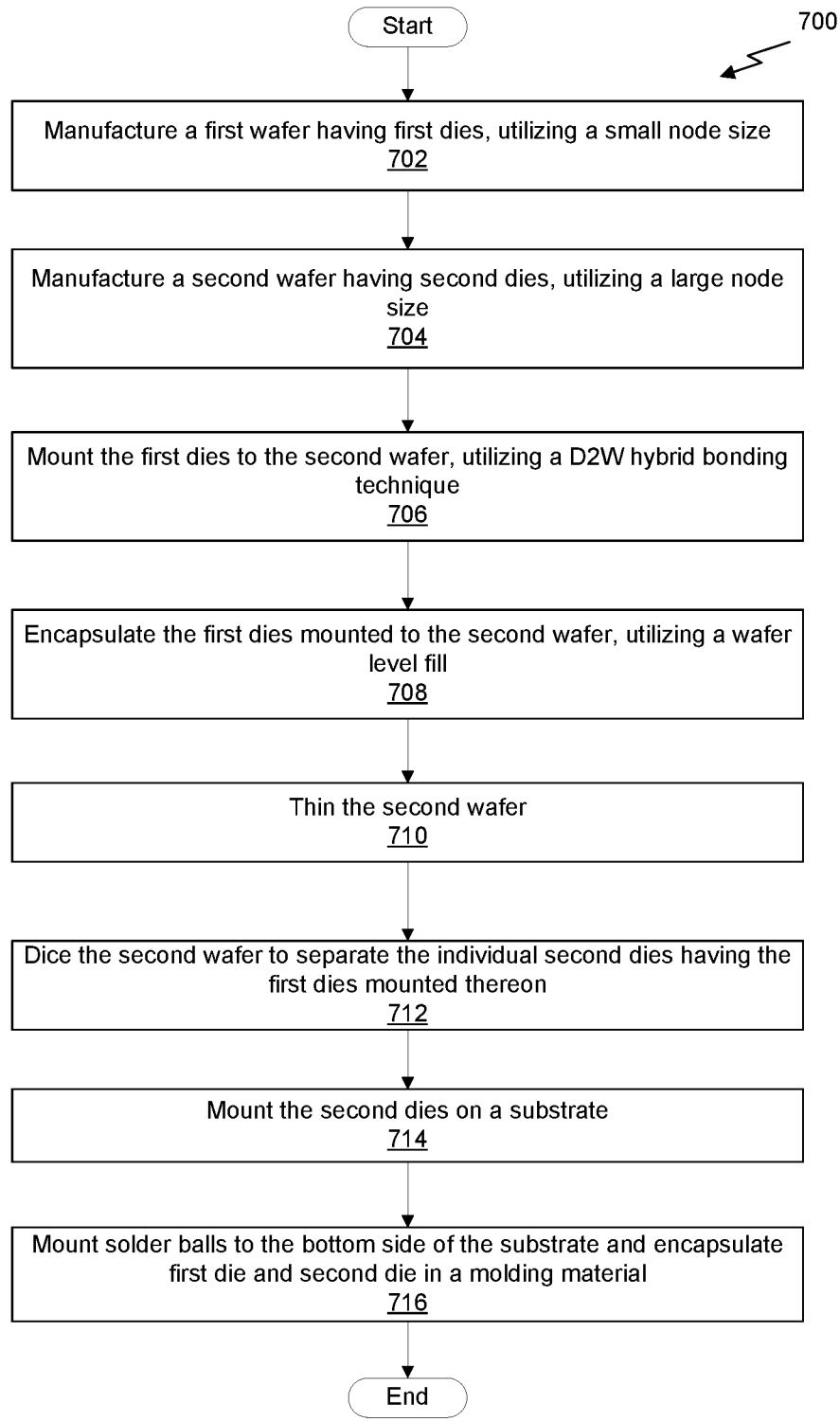
FIG. 7 is flowchart of a method for assembling an integrated circuit package, in accordance with one embodiment.

FIG. 7 is a flowchart of a method 700 for assembling an integrated circuit package, in accordance with one embodiment. As referenced below, the method 700 may be performed in the context of the technique for fabricating the IC package described above with respect to FIGS. 5A-5F. The method 700 may be performed by hardware, or a combination of hardware and software, on one or more specialized machines. In one embodiment, the method 700 is implemented, at least in part, by silicon wafer processing machinery.

In step 702, a first wafer 510 having first dies is manufactured, utilizing a small node size (e.g. as shown in FIG. 5A). The first wafer 510 includes a plurality of first dies 302. A top layer 512 of the first wafer 510 includes metal pads (e.g., copper pads). The first wafer 510 may be polished using a chemical-mechanical planarization (CMP) process to create a flat surface on the top layer 512 of the first wafer. The first wafer 510 may then be diced to separate each of the first dies 302.

In step 704, a second wafer 520 having second dies is manufactured, utilizing a large node size (e.g. as shown in FIG. 5B). The second wafer 520 includes a plurality of second dies 304. A top layer 522 of the second wafer 520 includes metal pads (e.g., copper pads). The second wafer 520 may be polished using a chemical-mechanical planarization (CMP) process to create a flat surface on the top layer 522 of the second wafer 520.

In step 706, a plurality of first dies 302 are mounted to the second wafer 520 utilizing a D2 W hybrid bonding technique (e.g. as shown in FIG. 5C). Again, in the D2 W hybrid bonding technique, the first dies 302 are flipped and placed top layer 512 down onto the top layer 522 of the second wafer 520 such that metal pads on the first dies 302 align with corresponding metal pads of the second dies 304 in the second wafer 520. The pads bond directly at an interface between corresponding pads, forming a connection between the dies. In another embodiment, the die-to-die interface could be formed via micro bumps with solder (i.e., solder bumps having a pitch less than 20 μm) or through electrodeless plating.

In step 708, a wafer level fill is utilized to encapsulate the first dies 302 mounted to the second wafer 520 (e.g. as shown in FIG. 5D). The wafer level fill may be a molding material 530, such as an epoxy resin composite with filler material.

In step 10, the second wafer 520 is thinned by using (e.g. as shown in FIG. 5E), e.g. mechanical grinding, CMP, wet etching, atmospheric downstream plasma (ADP) dry chemical etching (DCE), and the like. The second wafer 520 is thinned because larger wafer sizes may be used to manufacture the second wafer 520, and the larger wafer sizes require a thicker silicon substrate. However, thin dies may be the goal to reduce package thickness. One technique for thinning the die is to reduce the thickness of the back side of the dies after the integrated circuits have been formed on the top layer of the wafer. After thinning, through silicon vias (TSVs) 540 may be formed in the bottom layer of the second dies 304 in the second wafer 520.

In step 712, the second wafer 520 is then diced to separate the individual second dies 304. It will be appreciated that each second die 304 has a corresponding first die 302 mounted thereto, and that the first die 302 is encapsulated in the molding material 530. In step 714, each of the second dies is mounted on a substrate 410, via bump sites formed on pads corresponding to each TSV 540 on the bottom surface of the second die 304 (e.g. as shown in FIG. 5F). In step 716, solder balls 405 are added to the bottom side of the substrate 410, and the first die 302 and second die 304 are further encapsulated in a molding material 420 (e.g. as also shown in FIG. 5F). In addition, a decoupling capacitor 430 may be mounted to a bottom surface of the substrate 410. It will be appreciated that, in some embodiments, the IC package 400 may be stacked with one or more additional other packages to create a PoP assembly.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the embodiments as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An integrated circuit (IC) package, comprising:
   a first die, including digital base band logic and a first metal layer, formed on a first wafer utilizing a first node size;
   a second die, including analog base band logic and a second metal layer, formed on a second wafer utilizing a second node size, wherein the first die is mounted on a top surface of the second die using a hybrid bonding technique;
   a shielding formed by the second metal layer to reduce interference from signals in the first die, wherein the analog base band logic is positioned in the second die below the second metal layer which is disposed below the first die; and
   a substrate coupled to the second die at a plurality of bump sites on a bottom surface of the second die.

2. The IC package of claim 1, wherein the first node size is smaller than the second node size.

3. The IC package of claim 1, wherein the first node size is less than or equal to 16 nm.

4. The IC package of claim 1, wherein the first die includes a plurality of macroblocks of logic suitable to be implemented at the first node size, and wherein the second die includes a plurality of macroblocks of logic suitable to be implemented at the second node size.

5. The IC package of claim 1, wherein at least one metal layer in the first die or at least one metal layer in the second die is coupled to a ground potential.

6. The IC package of claim 1, wherein at least one output pad on the first die is coupled to a buffer included in the first die that is used to drive a signal coupled to at least one corresponding input pad on the second die, and wherein the at least one corresponding input pad on the second die is coupled to protection circuitry in the second die.

7. The IC package of claim 1, wherein the first die is mounted to the second die utilizing a wafer hybrid bonding technique that comprises:
   polishing a top surface of the first wafer using a chemical-mechanical planarization (CMP) process;
   dicing the first wafer to separate a plurality of first dies from the first wafer; polishing a top surface of the second wafer using the CMP process; and
   placing the plurality of first dies on the top surface of the second wafer such that metal pads in the top surface of the first dies are interfaced with corresponding metal pads in the top surface of the second wafer.

8. The IC package of claim 1, wherein the first die includes one or more processing units, a level 2 cache, and a memory controller fabric, and wherein the second die includes a level 3 cache.

9. The IC package of claim 8, wherein the level 2 cache is configured to transmit a memory request to the level 3 cache in the second die in response to a cache miss in the level 2 cache, and wherein the level 3 cache is configured to transmit a memory request to the memory controller fabric in the first die in response to a cache miss in the level 3 cache.

10. The IC package of claim 8, wherein the one or more processing units in the first die are connected to the level 3 cache and configured to bypass the level 2 cache.

11. The IC package of claim 8, wherein the level 3 cache is one of static random access memory (SRAM), embedded dynamic random access memory (eDRAM), thyristor DRAM, or magnetoresistive random access memory (MRAM).

12. The IC package of claim 1, wherein a first decoupling capacitor is mounted to the substrate and coupled to a supply voltage provided to the second die.

13. The IC package of claim 12, wherein the second die includes a second decoupling capacitor implemented in the integrated circuits of the second die, and wherein a local voltage regulator is included in the second die and configured to generate a regulated voltage coupled to the second decoupling capacitor.

14. The IC package of claim 13, wherein the first die includes a dynamic voltage and frequency scaling logic configured to generate a control signal transmitted to the local voltage regulator in the second die.

15. The IC package of claim 1, wherein the digital base band logic is positioned in the first die below the first metal layer to form a shielding to reduce interference from signals in the second die.

16. The IC package of claim 6, wherein the at least one output pad on the first die is not coupled to input/output driver logic.

17. A system, comprising:
an integrated circuit (IC) package including:
a first die, including digital base band logic and a first metal layer, formed on a first wafer utilizing a first node size,
a second die, including analog base band logic and a second metal layer, formed on a second wafer utilizing a second node size, wherein the first die is mounted on a top surface of the second die using a hybrid bonding technique,
a shielding formed by the second metal layer to reduce interference from signals in the first die, wherein the analog base band logic is positioned in the second die below the second metal layer which is disposed below the first die, and
a substrate coupled to the second die at a plurality of bump sites on a bottom surface of the second die.

18. The system of claim 17, wherein the first node size is smaller than the second node size.

19. The system of claim 18, wherein the first node size is less than or equal to 16 nm.

20. The system of claim 17, wherein the first die includes a plurality of macroblocks of logic suitable to be implemented at the first node size, and wherein the second die includes a plurality of macroblocks of logic suitable to be implemented at the second node size.

21. The system of claim 17, wherein the first die is mounted to the second die utilizing a wafer hybrid bonding technique that comprises:
polishing a top surface of the first wafer using a chemical-mechanical planarization (CMP) process;
dicing the first wafer to separate a plurality of first dies from the first wafer; polishing a top surface of the second wafer using the CMP process; and
placing the plurality of first dies on the top surface of the second wafer such that metal pads in the top surface of the first dies are interfaced with corresponding metal pads in the top surface of the second wafer.

22. The system of claim 17, wherein the first die includes one or more processing units, a level 2 cache, and a memory controller fabric, and wherein the second die includes a level 3 cache.

23. The system of claim 22, wherein the level 2 cache is configured to transmit a memory request to the level 3 cache in the second die in response to a cache miss in the level 2 cache, and wherein the level 3 cache is configured to transmit a memory request to the memory controller fabric in the first die in response to a cache miss in the level 3 cache.

24. The system of claim 22, wherein the one or more processing units in the first die are connected to the level 3 cache and configured to bypass the level 2 cache.

25. The system of claim 22, wherein the level 3 cache is one of static random access memory (SRAM), enhanced dynamic random access memory (eDRAM), thyristor DRAM, or magnetoresistive random access memory (MRAM).

26. The system of claim 17, wherein a first decoupling capacitor is mounted to the substrate and coupled to a supply voltage provided to the second die, and wherein the second die includes a second decoupling capacitor implemented in the integrated circuits of the second die, and wherein a local voltage regulator is included in the second die and configured to generate a regulated voltage coupled to the second decoupling capacitor.

27. The system of claim 26, wherein the first die includes a dynamic voltage and frequency scaling logic configured to generate a control signal transmitted to the local voltage regulator in the second die.

* * * * *